United States Patent
Schulze et al.

(10) Patent No.: US 10,134,845 B2
(45) Date of Patent: Nov. 20, 2018

(54) METHOD AND POWER SEMICONDUCTOR DEVICE HAVING AN INSULATING REGION ARRANGED IN AN EDGE TERMINATION REGION

(71) Applicant: Infineon Technologies Austria AG, Villach (AT)

(72) Inventors: Hans-Joachim Schulze, Taufkirchen (DE); Franz Hirler, Isen (DE); Anton Mauder, Kolbermoor (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/199,135

(22) Filed: Jun. 30, 2016

(65) Prior Publication Data

US 2016/0315150 A1 Oct. 27, 2016

Related U.S. Application Data

(62) Division of application No. 13/963,035, filed on Aug. 9, 2013, now Pat. No. 9,431,490.

(51) Int. Cl.
*H01L 29/10* (2006.01)
*H01L 21/02* (2006.01)
(Continued)

(52) U.S. Cl.
CPC .... *H01L 29/1083* (2013.01); *H01L 21/02365* (2013.01); *H01L 21/22* (2013.01);
(Continued)

(58) Field of Classification Search
CPC .......... H01L 29/1083; H01L 29/7811; H01L 29/7823; H01L 29/0642; H01L 29/0649
See application file for complete search history.

(56) References Cited

U.S. PATENT DOCUMENTS 7,667,267 B2 * 2/2010 Yamada ............. H01L 29/0653
257/335
8,080,858 B2 12/2011 Hirler et al.
(Continued)

FOREIGN PATENT DOCUMENTS

CN 101097947 A 1/2008
DE 102006036347 B4 1/2012

OTHER PUBLICATIONS

"Layer", Miriam-Webster online dictionary, http://www.merriam-webster.com/dictionary/layer (accessed Jun. 24, 2015), pp. 1-4.
(Continued)

*Primary Examiner* — Eric Ward
*Assistant Examiner* — Eric Ashbahian
(74) *Attorney, Agent, or Firm* — Murphy, Bilak & Homiller, PLLC

(57) ABSTRACT

A power semiconductor device includes a semiconductor body having first and second opposing sides and an edge termination region arranged between an active region and an outer rim. The semiconductor body further includes a first doping region in the active region and connected to a first electrode arranged on the first side of the semiconductor body, a second doping region in the active region and the edge termination region and connected to a second electrode arranged on the second side of the semiconductor body, a drift region between the first doping region and the second doping region, the drift region comprising a first portion adjacent to the first side of the semiconductor body and a second portion arranged between the first portion and the second doping region, and an insulating region arranged in the edge termination region between the second doping region and the first portion of the drift region.

17 Claims, 13 Drawing Sheets

(51) Int. Cl.
| | |
|---|---|
| H01L 21/22 | (2006.01) |
| H01L 29/36 | (2006.01) |
| H01L 29/66 | (2006.01) |
| H01L 29/739 | (2006.01) |
| H01L 29/78 | (2006.01) |
| H01L 21/324 | (2006.01) |
| H01L 29/861 | (2006.01) |
| H01L 21/306 | (2006.01) |
| H01L 29/74 | (2006.01) |
| H01L 29/778 | (2006.01) |
| H01L 29/808 | (2006.01) |
| H01L 29/40 | (2006.01) |
| H01L 29/417 | (2006.01) |
| H01L 29/06 | (2006.01) |
| H01L 29/08 | (2006.01) |

(52) U.S. Cl.
CPC .... *H01L 21/30604* (2013.01); *H01L 21/3247* (2013.01); *H01L 29/0638* (2013.01); *H01L 29/0649* (2013.01); *H01L 29/0653* (2013.01); *H01L 29/36* (2013.01); *H01L 29/402* (2013.01); *H01L 29/66068* (2013.01); *H01L 29/7395* (2013.01); *H01L 29/7396* (2013.01); *H01L 29/7397* (2013.01); *H01L 29/74* (2013.01); *H01L 29/7788* (2013.01); *H01L 29/7811* (2013.01); *H01L 29/7813* (2013.01); *H01L 29/8083* (2013.01); *H01L 29/861* (2013.01); *H01L 29/8611* (2013.01); H01L 29/0619 (2013.01); H01L 29/0634 (2013.01); H01L 29/0878 (2013.01); H01L 29/1095 (2013.01); H01L 29/407 (2013.01); H01L 29/41766 (2013.01)

(56) References Cited

U.S. PATENT DOCUMENTS

| | | | |
|---|---|---|---|
| 9,455,339 B2* | 9/2016 | Chan | H01L 29/7394 |
| 2001/0035561 A1* | 11/2001 | Hirler | H01L 21/764 |
| | | | 257/510 |
| 2008/0261358 A1* | 10/2008 | Sonsky | H01L 21/3247 |
| | | | 438/197 |
| 2012/0146133 A1 | 6/2012 | Hirler et al. | |
| 2013/0221403 A1* | 8/2013 | Lu | H01L 21/761 |
| | | | 257/139 |

OTHER PUBLICATIONS

"Region", Miriam-Webster online dictionary, http://www.merriam-webster.com/dictionary/region (accessed Jun. 24, 2015), pp. 1-4.

* cited by examiner

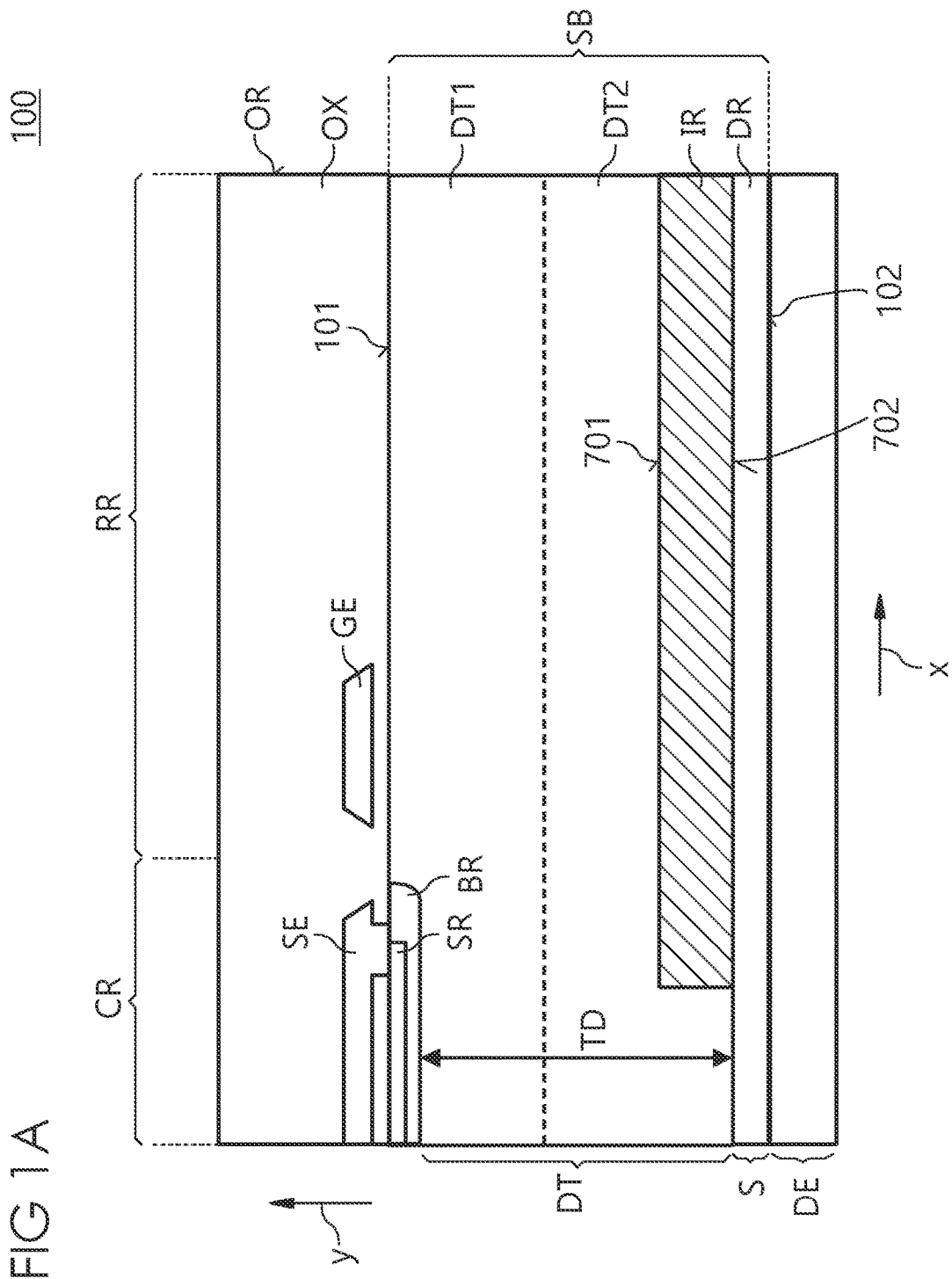

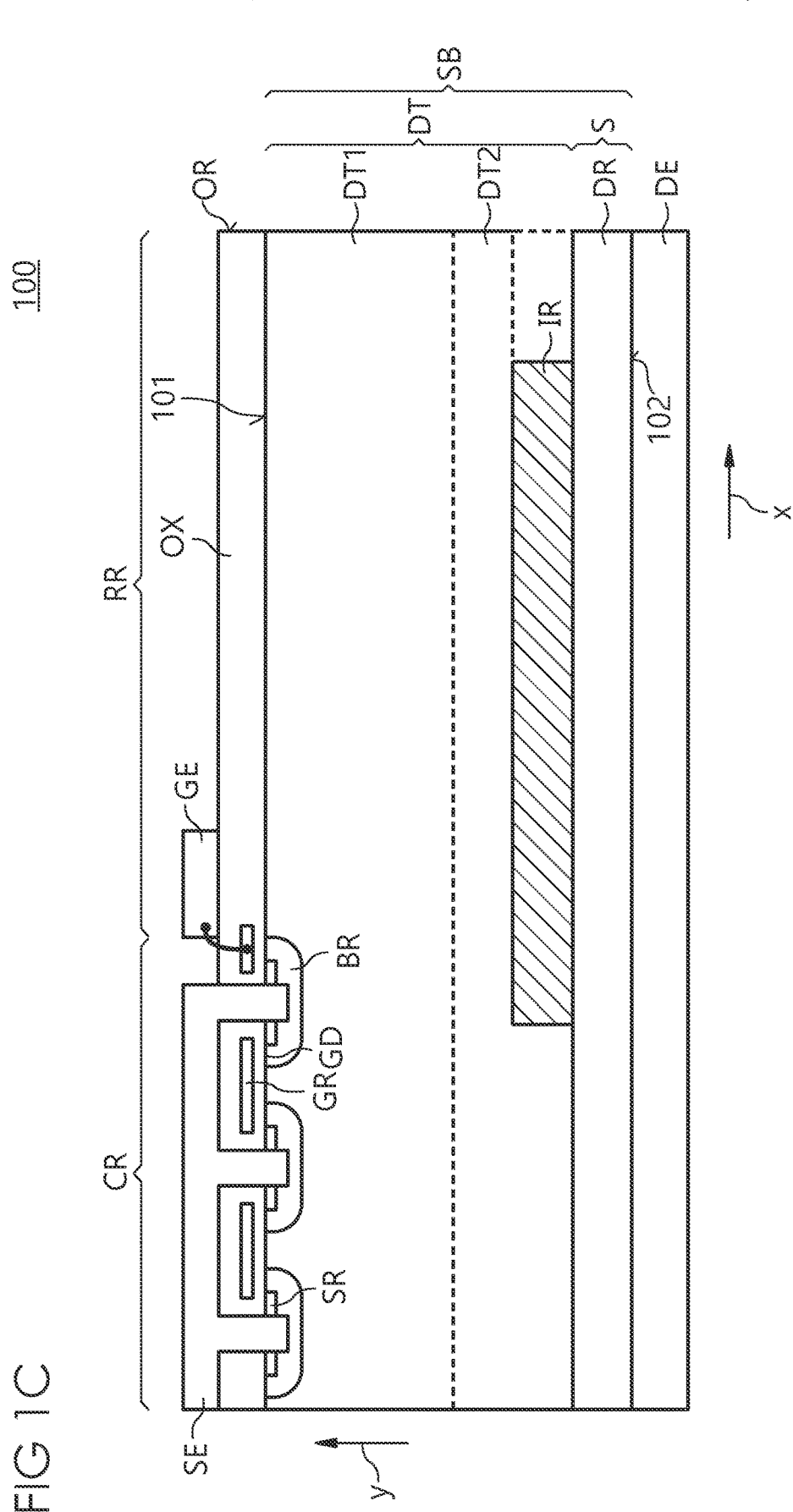

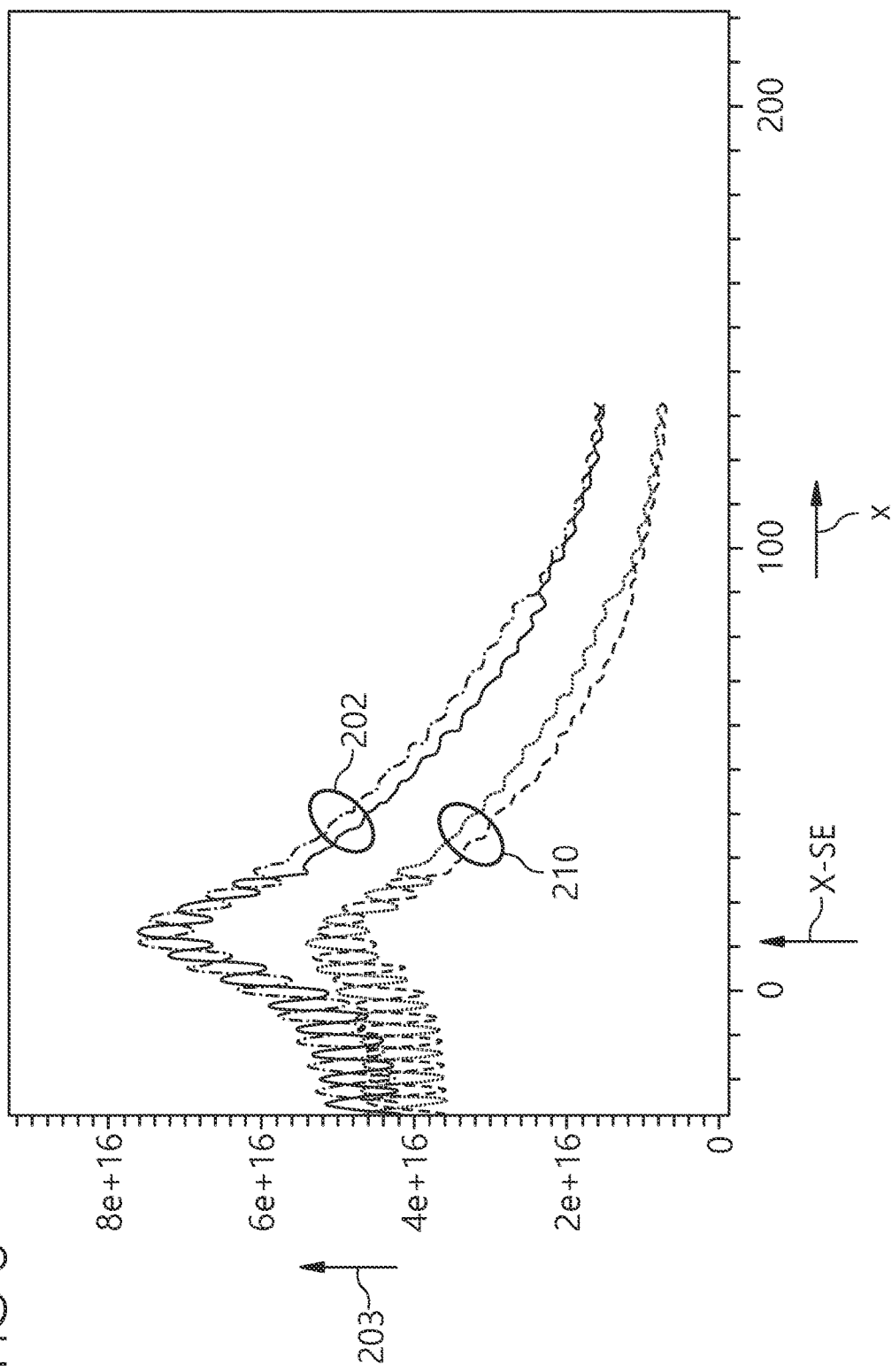

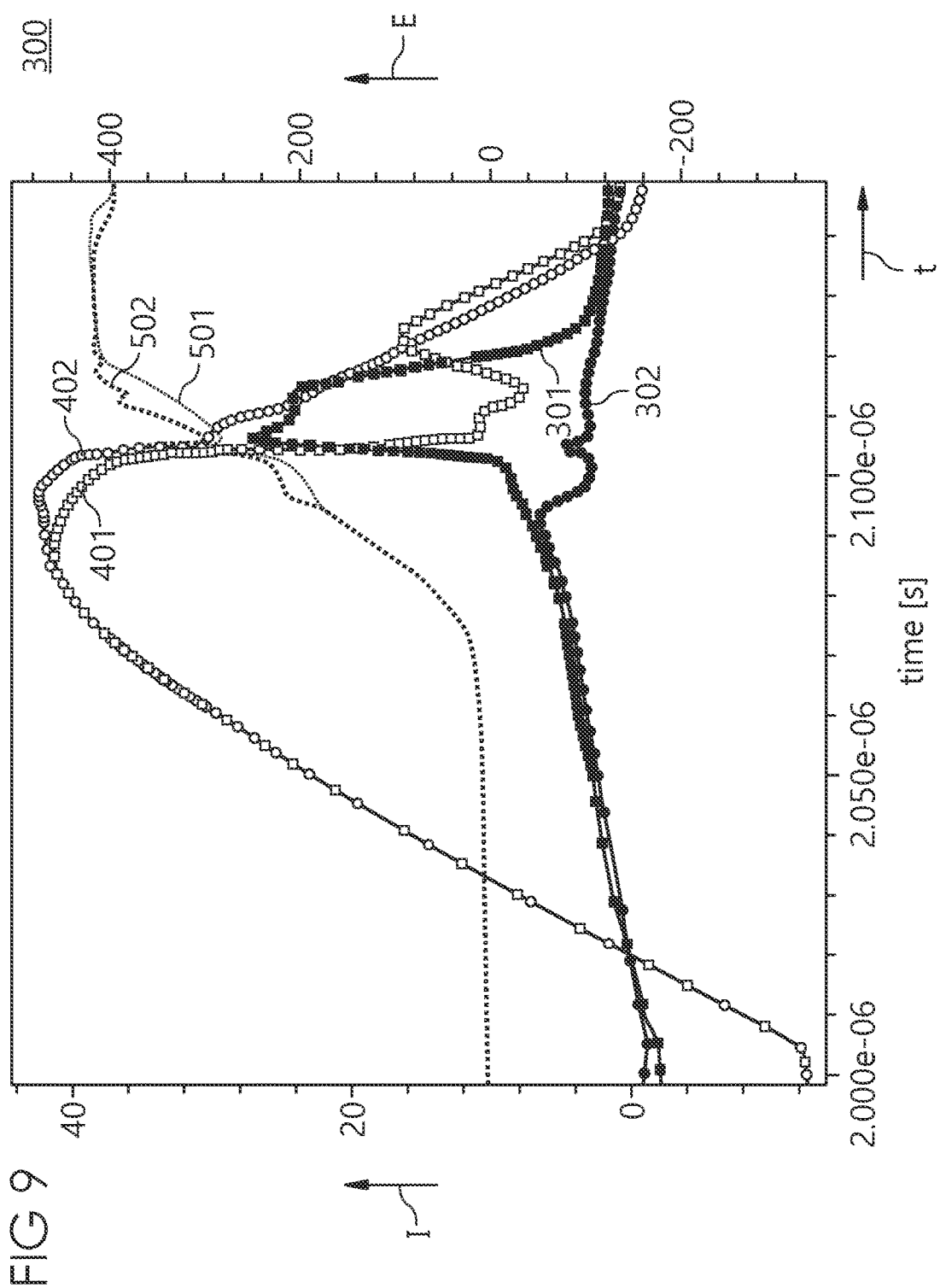

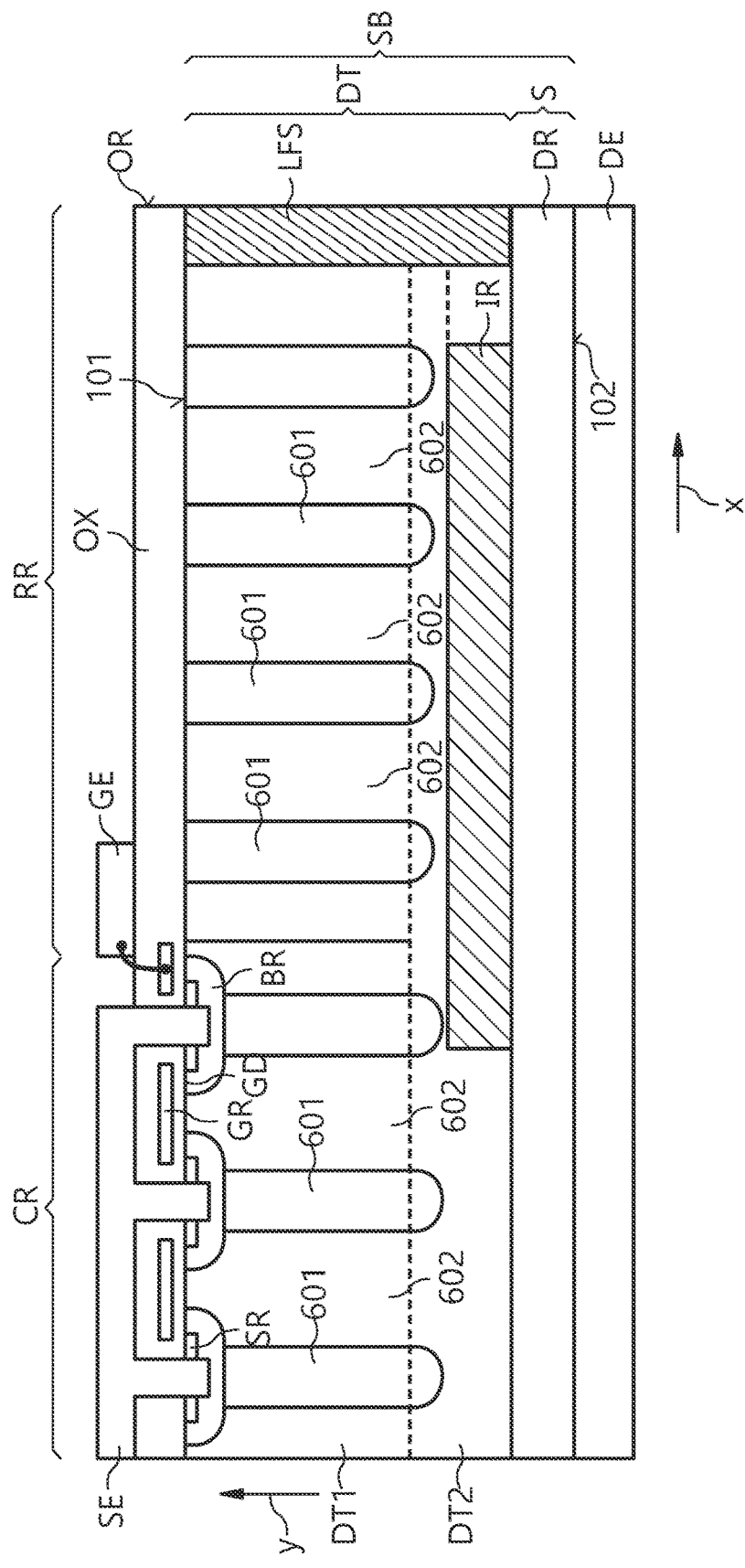

METHOD AND POWER SEMICONDUCTOR DEVICE HAVING AN INSULATING REGION ARRANGED IN AN EDGE TERMINATION REGION

TECHNICAL FIELD

Embodiments described herein relate to power semiconductor devices and to methods for switching high electrical powers.

BACKGROUND

Power semiconductor switches, in particular field-effect controlled switching devices such as a Metal Oxide Semiconductor Field-effect Transistor (MOSFET) or an Insulated Gate Bipolar Transistor (IGBT) have been used for various applications including but not limited to use as switches in power supplies and power converters, electric cars, air-conditioners, and even electrical grids used by renewable energy suppliers. Particularly with regard to power semiconductor devices capable of switching large currents and/or operating at higher voltages, currents propagating in an edge termination region of a power semiconductor body are an issue.

Thereby, semiconductor switches are prone to over-currents and over-voltages, which might be caused by circuit failures. Although measures are typically provided for discharging the over-currents and voltages, such measures cannot be completely implemented.

In view of the above, there is a need for improvement.

SUMMARY

According to an embodiment, a power semiconductor device includes a semiconductor body having a first side, a second side opposite the first side and an outer rim. The semiconductor body includes an active region and an edge termination region arranged between the active region and the outer rim. The semiconductor body further includes a first doping region in the active region connected to a first electrode arranged on the first side of the semiconductor body, a second doping region in the active region and the edge termination region connected to a second electrode arranged on the second side of the semiconductor body, a drift region between the first doping region and the second doping region, wherein the drift region includes a first portion adjacent to the first side of the semiconductor body and a second portion arranged between the first portion and the second doping region, and an insulating region arranged in the edge termination region between the second doping region of the semiconductor body and the first portion of the drift region.

According to an embodiment, a power semiconductor device includes a semiconductor body having a first side, a second side opposite the first side and an outer rim. The semiconductor body includes an active region and an edge termination region arranged between the active region and the outer rim. The semiconductor body further includes a first doping region in the active region and connected to a first electrode arranged on the first side of the semiconductor body, a second doping region in the active region and the edge termination region and connected to a second electrode arranged on the second side of the semiconductor body, a drift region between the first doping region and the second doping region, and an insulating region arranged in the edge termination region and at least partially within the second doping region, wherein the insulating region forms a blocking region in the edge termination region to at least partially block a vertical transit of charge carriers.

According to an embodiment, a power semiconductor device includes a semiconductor body having a first side, a second side opposite the first side and an outer rim. The semiconductor body includes an active region and an edge termination region arranged between the active region and the outer rim. The semiconductor body further includes a first doping region in the active region and connected to a first electrode arranged on the first side of the semiconductor body, a second doping region in the active region and the edge termination region and connected to a second electrode arranged on the second side of the semiconductor body, a drift region between the first doping region and the second doping region, a field stop zone arranged between the drift region and the second doping region, wherein the field stop zone has a higher doping concentration than the drift region and is of a same conductivity type as the drift region, and an insulating region arranged in the edge termination region adjacent to the drain region and at least partially within the field stop zone, wherein the insulating region forms a blocking region in the edge termination region to at least partially block a vertical transit of charge carriers.

According to an embodiment, a method for manufacturing a power semiconductor device includes: providing a semiconductor substrate having a surface; forming a first epitaxial layer on the surface of the semiconductor substrate; etching one or more trenches in the first epitaxial layer; annealing the first epitaxial layer including the one or more trenches in a hydrogen atmosphere to convert the one or more trenches into one or more cavities; forming a second epitaxial layer on the first epitaxial layer after the annealing of the first epitaxial layer, wherein the substrate, the first epitaxial layer and the second epitaxial layer form a semiconductor body having a first side, a second side opposite the first side and an outer rim, the semiconductor body including an active region and an edge termination region arranged between the active region and the outer rim; forming a first doping region in the active region; forming a first electrode arranged on the first side of the semiconductor body in contact with the first doping region; forming a second doping region in the active region and the edge termination region; and forming a second electrode arranged on the second side of the semiconductor body in contact with the second doping region.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 1A illustrates a cross-sectional view of a power semiconductor chip including an insulating region, according to an embodiment;

FIG. 1C illustrates a cross-sectional view of a power semiconductor chip including an insulating region, according to yet another embodiment;

FIG. 8 illustrates a graph showing lateral current density distributions, according to an embodiment;

FIG. 9 illustrates a graph showing time-dependent current density distributions, according to an embodiment;

FIG. 11 illustrates another semiconductor circuit element, which includes an insulating region.

DETAILED DESCRIPTION

Figure 1B:
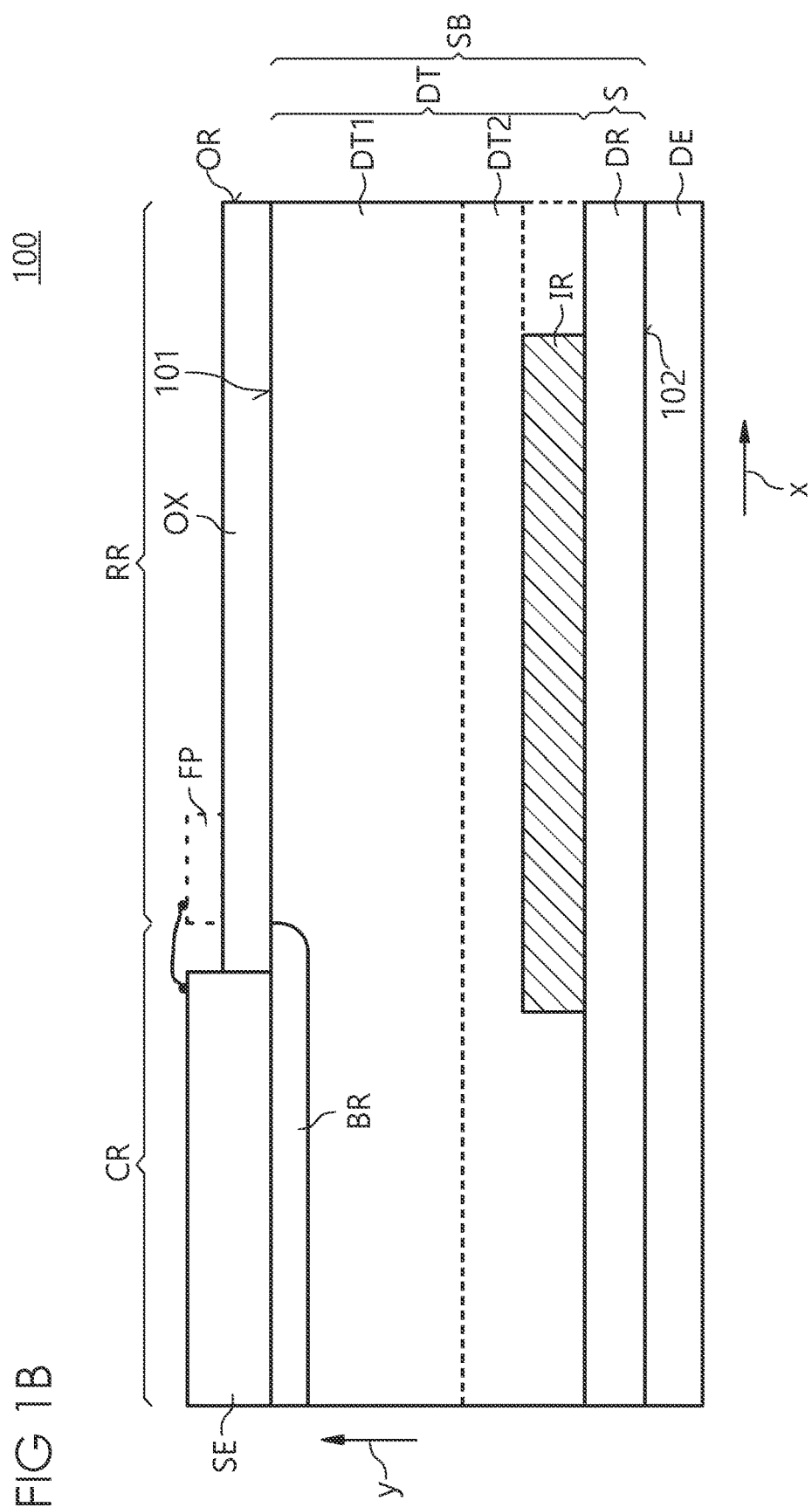
FIG. 1B illustrates a cross-sectional view of a power semiconductor chip including an insulating region, according to another embodiment.

In the following Detailed Description, reference is made to the accompanying drawings, which form a part hereof, and in which are shown by way of illustration specific embodiments in which the invention can be practiced. In this regard, directional terminology, such as "top", "bottom", "front", "back", "leading", "trailing" "lateral", "vertical" etc., is used with reference to the orientation of the Figure(s) being described. Because components of embodiments can be positioned in a number of different orientations, the directional terminology is used for purpose of illustration and is in no way limiting. It is to be understood that other embodiments can be utilized and structural or logical changes can be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

In the drawings, a lateral direction is denoted by a reference numeral x. Furthermore, in the drawings the vertical direction is denoted by a reference numeral y.

In this specification, a second surface of a semiconductor substrate is considered to be formed by the lower or backside surface while a first surface is considered to be formed by the upper, front or main surface of the semiconductor substrate. The terms "above" and "below" as used in this specification therefore describe a relative location of a structural feature to another structural feature with consideration of this orientation.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively.

In the context of the present specification, the term "metal" for the gate material of the MOSFET should be understood as including electrically conductive materials such as, but not restricted to, metal, alloys, doped polycrystalline semiconductors and metal semiconductor compounds like metal silicides.

Field-effect controlled switching devices such as Metal Oxide Semiconductor Field Effect Transistors (MOSFETs) or Insulated Gate Bipolar Transistors (IGBTs) have been used for various applications, including use as switches in power supplies and power converters, electric cars, air-conditioners, and even stereo systems. Particularly with regard to power devices capable of switching large currents and/or operating at higher voltages, a low resistance in the conducting on-state is often desired. This means e.g. that, for a given current to be switched, the voltage drop across the switched on FET, i.e., the source-drain voltage is desired to be low. On the other hand, the losses occurring during switching off or commutating of the FET are often also to be kept small to minimize the overall losses.

The term "power semiconductor device" as used in this specification intends to describe a semiconductor device on a single chip with high voltage and/or high current switching capabilities. In other words, power semiconductor devices are intended for high current, typically in the Ampere range. Within this specification, the terms "solid-state power switch", "solid-state switching device" and "power semiconductor device" are used synonymously.

In the context of the present specification, a semiconductor region in which an inversion channel can be formed and/or controlled by the field effect is also referred to as body region. The term "field-effect" as used in this specification intends to describe the electric field mediated formation of an "inversion channel" and/or control of conductivity and/or shape of the inversion channel in a semiconductor region. The conductivity type of the channel region is typically changed, i.e., inverted, for forming a unipolar current path between two semiconductor regions of the inverted conductivity type which are adjacent to the channel region.

In the context of the present specification, the term "field-effect structure" intends to describe a structure which is formed in a semiconductor substrate or semiconductor device and has a gate electrode which is insulated at least from the body region by a dielectric region or dielectric layer. Examples of dielectric materials for forming a dielectric region or dielectric layer between the gate electrode and the body region include, without being limited thereto, silicon oxide (SiO$_2$), silicon nitride (Si$_3$N$_4$), silicon oxinitride (SiO$_x$N$_y$), zirconium oxide (ZrO$_2$), tantalum oxide (Ta$_2$O$_5$), titanium oxide (TiO$_2$) and hafnium oxide (HfO$_2$).

In the context of the present specification, the term "gate electrode" intends to describe an electrode which is situated next to, and insulated from the body region and configured to form and/or control a channel region through the body region.

In this specification, n-doped is referred to as first conductivity type while p-doped is referred to as second conductivity type. Alternatively, the semiconductor devices can be formed with opposite doping relations no that the first conductivity type can be p-doped and the second conductivity type can be n-doped. Furthermore, some figures illustrate relative doping concentrations by indicating "−" or "+" next to the doping type. For example, "n$^-$" means a doping concentration which is less than the doping concentration of an "n"-doping region while an "n$^+$"-doping region has a larger doping concentration than the "n"-doping region. However, indicating the relative doping concentration does not mean that doping regions of the same relative doping concentration have to have the same absolute doping concentration unless otherwise stated. For example, two different n$^+$-doping regions can have different absolute doping concentrations. The same applies, for example, to an n$^+$-doping and a p$^+$-doping region.

The terms "electrical connection" and "electrically connected" describes an ohmic connection between two elements.

As used herein, the term "field stop zone" is intended to be representative of a zone of the semiconductor body, which is deposited above the substrate surface. The introduction of a field stop zone in a semiconductor chip facilitates the use of substrate material with low base doping or with a doping complementary to that of the field stop zone. Thereby, the field stop zone can be doped in such a way as to prevent penetration of a space charge zone into the substrate. Thus, reduction of breakdown voltage and/or "punch-through" of a semiconductor device on the chip can be avoided. Semiconductor devices including field stop zones are denoted as field stop components and include, but are not limited to, power MOSFETs, Insulated Gate Bipolar Transistors (IGBTs), thyristors, diodes or bipolar transistors. As used herein, the term "lateral field stop zone" is intended to be representative of a zone of the semiconductor body, which is arranged at an outer rim of the semiconductor body, at least partially within an edge termination region. Within this specification the terms "field stop zone", "field stop layer", and "field stop region" are used synonymously.

FIG. 1A illustrates a cross-sectional view of a power semiconductor device 100 including a semiconductor body SB having a first side 101, a second side 102 opposite the first side 101 and an outer rim OR, according to an embodiment. Moreover, the semiconductor body SB includes an active region CR and an edge termination region RR arranged between the active region CR and the outer rim OR of the semiconductor body SB. Furthermore, the semiconductor body SB can include a first doping region SR in the active region CR of the semiconductor body SB, the first doping region SR being connected to a first electrode SE arranged on the first side 101 of the semiconductor body SB. In addition to that, a second doping region DR in the active region CR and the edge termination region RR of the semiconductor body SB can be provided, the second doping region DR being connected to a second electrode DE arranged on the second side 102 of the semiconductor body SB. A body region BR of the second conductivity type can be arranged between the first doping region SR and a weakly n-doped drift region DT. The drift region DT is arranged between the body region BR and the second doping region DR, which is connected to a second terminal DE. The drift region DT includes a first portion DT1 adjacent to the first side 101 of the semiconductor body SB and a second portion DT2 arranged between the first portion DT1 and the second doping region DR. The drift region DT can have a dimension in a vertical direction y indicated by a curly bracket DT in FIG. 1A, i.e. a vertical drift region thickness TD, e.g. the drift region can have a given maximum thickness in the vertical direction. Furthermore, a vertical thickness of the first portion DT1 can amount to approximately 30% to 95% of the vertical drift region thickness TD of the drift region DT, more specifically to 60% to 90% of the vertical drift region thickness TD, and even more specifically can amount to 70% to 80% of the vertical drift region thickness TD. At least one insulating region IR is arranged in the edge termination region RR between the second doping region DR of the semiconductor body SB and the first portion of the drift region DT1. The insulating region IR has a first side 701, i.e. an upper side with respect to the vertical direction y, and a second side 702, i.e. a lower side with respect to the vertical direction y. According to an embodiment, the first side 701 of the insulating region IR can be arranged in a distance from the first doping region SR, wherein the distance can amount to approximately 30% to 120% of the given maximum thickness TD of the drift region DT or to approximately 60% to 95% of the given maximum thickness TD of the drift region DT. If the semiconductor power device 100 is provided as a transistor, e.g., but not limited to, a MOSFET, a MISFET or a JFET, the first electrode SE can be a source electrode, and the second electrode DE can be a drain electrode. Furthermore, a gate electrode GE can be provided. The semiconductor body SB can then be laterally subdivided into the active region CR or cell region and the edge termination region RR adjacent to the active region CR.

Furthermore, the power semiconductor device 100 can be provided as an IGBT, a JFET, a HEMT, a thyristor and a diode. According to an alternative embodiment, at least one insulating region IR can be arranged in the edge termination region RR of the semiconductor body SB and at least partially, within the second doping region DR, the insulating region IR forming a blocking region in the edge termination region RR to block, at least partially, a vertical transit of charge carriers. According to a further alternative, the insulating region IR can extend from the second portion DT2 of the drift region DT at least partially into the second doping region DR.

According to an embodiment illustrated in FIG. 1B, the power semiconductor device 100 is a two-terminal device, an example is a diode or a pin-diode. A body region BR of the second conductivity type can be arranged between the first doping region (not shown in FIG. 1B) and the weakly n-doped drift region DT. The drift region DT is arranged between the body region BR and the second doping region DR, which is connected to the second terminal DE. The first doping region connected to a first terminal SE can be of a second conductivity type such as p-type, and can be formed by a p-doped anode. The second doping region DR connected to a second terminal DE, can be of a first conductivity type such as n-type, and can be formed by a highly n-doped cathode region. The drift region DT can be of first doping type and can have a doping concentration less than the doping concentration of the cathode region. The drift region DT forms a pn-junction with the anode region. According to a further embodiment, the drift region DT can include a first portion DT1 adjacent to the first side 101 of the semiconductor body SB and a second portion DT2 arranged between the first portion DT1 and the second doping region DR. According to an embodiment, which can be combined with other embodiments described herein, a field plate FP can be provided which is adapted for defining an edge termination.

According to an embodiment illustrated in FIG. 1C, the power semiconductor device 100 is a three-terminal device such as a field-effect transistor (FET) or an insulated gate bipolar transistor (IGBT). The first doping region SR connected to a first terminal can be of the first conductivity type such as n-type, and can be formed by a highly n-doped source region. The drift region DT can be of the first doping type and has a doping concentration less than the doping concentration of the source region. A body region BR of the second conductivity type can be arranged between the source region and the weakly n-doped drift region. The drift region DT is arranged between the body region BR and the second doping region DR, which is connected to a second terminal DE and which can be formed of the first conductivity type, e.g. by a highly n-doped drain region in case of a FET or can be formed of the second conductivity type, e.g. a p-doped emitter region in case of an IGBT. The drift region DT forms a pn-junction with the body region BR. An optional field stop region of the first conductivity type can be arranged between the first portion DT1 of the drift region DT and the second doping region DR. The field stop region has a higher doping concentration than the first portion DT1 of the drift region DT. A gate region GR, which is electrically connected to a gate electrode GE and which is insulated from the body region BR by means of a gate dielectric GD, is connected to a third terminal. A channel region is formed in the body region BR next to the gate dielectric GD and connects the first doping region SR to the drift region DT. The conductivity of the channel region is controllable by a voltage applied to the gate electrode GE.

According to an embodiment, the power semiconductor device 100 is a bipolar device such as a diode or an IGBT. According to another embodiment, the power semiconductor device is a unipolar device such as a FET.

According to an embodiment, the gate region GR is a planar gate region and located substantially parallel to a surface of the first side 101 of the semiconductor body SB, the gate region being adapted for controlling an inversion channel in the body region BR which is substantially parallel to the first surface 101. According to a further embodiment, the gate region GR is partly located in a trench extending into the semiconductor body SB from the first side in a vertical direction and controlling the inversion channel in the body region BR, which is substantially perpendicular to the first surface 101.

The power semiconductor device 100 is provided in a vertical structure, i.e. current flow is substantially perpendicular to the surface of a substrate S, in a direction of an arrow indicated by a reference numeral y. As shown in FIGS. 1A-1C, the semiconductor body SB includes a substrate S, the second doping region or drain region DR in the substrate S, the drain region DR being connected to the drain electrode DE, the first doping region or source region SR connected to the source electrode SE, the drift region DT between the source region SR and the drain region DR, and the at least one insulating region IR. According to an embodiment, the drift region DT can have a given thickness TD depending on the rated blocking capability of the power semiconductor device 100. The thickness TD of the drift region DT in micrometer (μm) can be a linearly chosen from a desired blocking voltage BV in volt (V) of the power semiconductor device 100 according to the following equation (1):

$$TD = 6 \ldots 12 \times BV/100 \qquad (1)$$

As an example, assuming a blocking voltage BV of 60V, a typical thickness TD of the drift region DT of the power semiconductor device can amount to a range from 48 μm to 72 μm.

According to an embodiment, the drift region DT can have a given maximum thickness TD in a vertical direction, i.e. in a direction perpendicular to the surface of the semiconductor substrate, wherein the thickness of the first portion DT1 of the drift region DT can amount to approximately 30% to 95% of the given maximum thickness TD of the drift region DT, more specifically can amount to 60% to 90% of the given maximum thickness TD, and even more specifically can amount to 70% to 80% of the given maximum thickness TD.

According to an embodiment, which can be combined with other embodiments described herein, the insulating region IR can be arranged, at least partially, within the drift region DT, predominantly in the edge termination region or rim region RR and adjacent to the drain region DR, the insulating region IR covering, at least partially, the drain region DR and being adapted for blocking in the edge termination region RR, at least partially, a vertical transit of charge carriers through the drift region DT. The drain region DR can be at least partially included in the substrate S, which extends in an x-direction. According to an embodiment, which can be combined with other embodiments described herein, the insulating region IR can extend laterally across the edge termination region RR and a portion of the active region CR. Thereby, a major portion of a source-drain current through the semiconductor body SB can flow in the active region CR.

According to an embodiment, which can be combined with other embodiments described herein, the insulating region IR can be arranged, at least partially, within the drift region DT, predominantly in the edge termination region or rim region RR and adjacent to the drain region DR, the insulating region IR covering, at least partially, the second doping region DR and being adapted for blocking in the edge termination region RR, at least partially, a vertical transit of charge carriers through the drift region DT. The region DR can be at least partially included in the substrate S, which extends in an x-direction and can form, e.g. a p-doped emitter region of an IGBT. According to an embodiment, which can be combined with other embodiments described herein, the insulating region IR can extend laterally across the edge termination region RR and a portion of the active region CR. Thereby, a major portion of a source-drain current through the semiconductor body SB can flow in the active region CR.

The gate electrode GE is arranged next to and insulated from the semiconductor body region SB and configured to form and/or control a channel region through the body region. The source electrode SE and the gate electrode GE are embedded in a dielectric layer, e.g. in an insulating oxide OX, the oxide OX being selected from the group consisting of silicon oxide ($SiO_2$), silicon nitride ($Si_3N_4$), silicon oxinitride ($SiO_xN_y$), zirconium oxide ($ZrO_2$), tantalum oxide ($Ta_2O_5$), titanium oxide ($TiO_2$), hafnium oxide ($HfO_2$), or any combinations thereof.

The semiconductor body SB of the FET is laterally subdivided into the active region CR and the edge termination region RR adjacent to the active region CR. A vertical transit of charge carriers through the drift region DT is blocked due to the insulating region IR, at least partially. As indicated in FIGS. 1A-1C, the insulating region IR can laterally extend across the edge termination region RR and a portion of the active region CR. In this way, a current flow from the drain electrode DE to the source electrode SE is limited to an area in the drain region DR which is not covered by the insulating region IR. According to yet another embodiment which can be combined with embodiments described herein, the insulating region IR can laterally extend to the outer rim OR, as shown in FIG. 1A, or can end at a distance away from the outer rim OR, as depicted in FIGS. 1B and 1C.

According to an embodiment, a method is provided for reducing charge carrier concentration in the edge termination region RR of the power semiconductor device 100. The method includes the steps of providing the at least one insulating region IR arranged between the drain region DR and the source region SR, covering, at least partially, the drain or emitter region DR predominantly in the edge termination region RR, by means of the insulating region IR, and blocking in the edge termination region RR, at least partially, a vertical transit of charge carriers through the drift region DT. According to an alternative, blocking the transit of free charge carriers between the drain region DR and the drift region DT further can include recombining free charge carriers at least at one interface of the insulating region IR.

According to an embodiment which can be combined with other embodiments described herein, a method of forming an insulating region within a semiconductor body SB, in particular in the edge termination region RR of the semiconductor body SB can be provided. The method includes providing a substrate S, forming the semiconductor body SB by depositing at least one first epitaxial layer onto the substrate S, etching at least one trench in the deposited epitaxial layer, annealing the semiconductor body SB in an atmosphere containing hydrogen, and depositing at least one further epitaxial layer onto the annealed semiconductor body SB, wherein the insulating region is formed as a cavity in the first epitaxial layer and/or in the substrate at the location of the trench. According to a further embodiment which can be combined with other embodiments described herein, a method of forming an insulating region within a semiconductor body SB, in particular in the edge termination region RR of the semiconductor body SB can be provided. The method includes providing a substrate S, forming the semiconductor body SB by etching at least one trench in the substrate, annealing the semiconductor body SB in an atmosphere containing hydrogen, and depositing at least one further epitaxial layer onto the annealed semiconductor body SB, wherein the insulating region is formed as a cavity in the substrate at the location of the trench.

According to a further modification thereof, forming the cavity between the epitaxial layers at the location of the trench 104 includes providing a three-dimensional shape of the insulating region IR, which is selected from the group consisting of a spherical shape, a cylindrical shape, a cuboid shape, a cavern shape, a toroid shape, and any combinations thereof. According to an embodiment, a method can be provided for manufacturing the power semiconductor device 100. The method can include providing a semiconductor substrate having a surface, forming an optional first epitaxial layer on the surface of the semiconductor substrate, etching one or more trenches in the first epitaxial layer and/or in the substrate, annealing the substrate and/or the first epitaxial layer including the one or more trenches in an atmosphere containing hydrogen to convert the one or more trenches into one or more cavities, forming a second epitaxial layer on the substrate and/or the first epitaxial layer after the annealing step, wherein the substrate, the optional first epitaxial layer and the second epitaxial layer form the semiconductor body SB; forming the first doping region SR in the active region CR of the semiconductor body SB, forming the first electrode SE arranged on the first side 101 of the semiconductor body SB in contact with the first doping region SR, forming the second doping region DR in the active region CR and the edge termination region RR of the semiconductor body SB, and forming the second electrode DE arranged on the second side 102 of the semiconductor body SB in contact with the second doping region DR.

According to another embodiment which can be combined with embodiments described herein, a further cavity can be arranged in the edge termination region RR between the first portion DT1 of the drift region DT and the second side 102 of the semiconductor body SB, wherein the cavity and the further cavity are arranged at different depths with respect to the first side 101 of the semiconductor body. According to a modification, blocking the transit of free charge carriers between the drain region DR and the drift region DT further includes recombining free charge carriers at least at one interface of the insulating region IR. Thereby, an amount of electric charges stored in the drift region DT can be reduced.

According to an embodiment which can be combined with other embodiments described herein, a method for manufacturing a power semiconductor device is provided. The method includes providing a semiconductor substrate having a surface, etching one or more trenches in one of a first epitaxial layer or the substrate, annealing the semiconductor substrate including the one or more trenches in an atmosphere containing hydrogen to convert the one or more trenches into one or more cavities, forming a second epitaxial layer on the substrate after the annealing in an atmosphere containing hydrogen, wherein the substrate, the first epitaxial layer and the second epitaxial layer form a semiconductor body having a first side, a second side opposite the first side and an outer rim, the semiconductor body including an active region and an edge termination region arranged between the active region and the outer rim, forming a first doping region in the active region of the semiconductor body, forming a first electrode arranged on the first side of the semiconductor body in contact with the first doping region, forming a second doping region in the active region and the edge termination region of the semiconductor body, and forming a second electrode arranged on the second side of the semiconductor body in contact with the second doping region.

Figure 2:
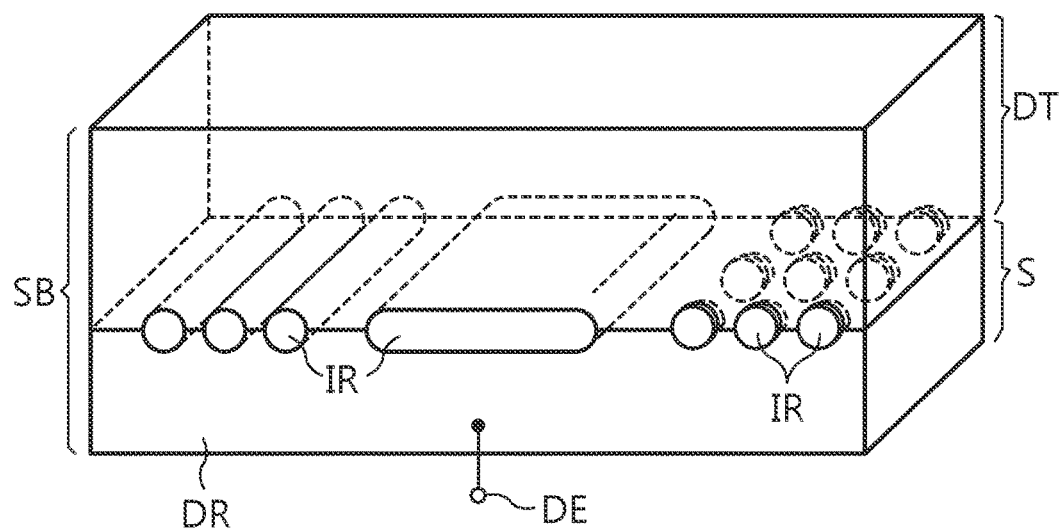
FIG. 2 illustrates a perspective view of a portion of a semiconductor chip including insulating regions, according to an embodiment.

FIG. 2 illustrates a perspective view of a portion of a power semiconductor device 100 according to an embodiment. The power semiconductor device 100 has a semiconductor body SB, which includes the substrate S and the drift region DT. For illustration purpose, different structures of insulating regions IR are shown to be embedded in the drift region DT, adjoining the substrate S. The substrate S is provided as the drain region or as the emitter region DR of the power semiconductor device 100.

The drain region or the emitter region DR is electrically connected to the drain electrode or emitter electrode DE. On the left side of FIG. 2, three insulating regions of cylindrical shape are depicted. The processing steps which are performed for obtaining a formation of such cylindrical insulating structures will be described herein below with respect to FIGS. 3-5. A flat cavity formation is shown in the center of FIG. 2. The processing steps which are performed for obtaining a formation of such flat cavity insulating structures will be described herein below with respect to FIGS. 3-5. A formation of spherical insulating structures is shown on the right side of FIG. 2. The processing steps which are performed for obtaining a formation of such spherical insulating structures will be described herein below with respect to FIGS. 3-5.

According to an embodiment, the insulating region IR can be provided as a cavity of a specified shape. According to an alternative modification, the cavity can be filled with a gas selected from the group consisting of air, argon, nitrogen, oxygen, hydrogen, and any combinations thereof. Thereby, thermal stress during manufacturing of the power semiconductor device 100 can be avoided or at least reduced, because gas is compressible and thus less prone to stress and/or force transfer from/to surrounding semiconductor material.

According to alternative embodiments, which can be combined with embodiments described herein, the insulating region IR can have different shapes. A three-dimensional formation of the insulating region IR thus can be selected from the group consisting of a spherical shape, a cylindrical shape, a cuboid shape, a cavern shape, a toroid shape, and any combinations thereof. According to another embodiment, which can be combined with embodiments described herein, the three-dimensional shape of the insulating region IR, which is selected from the group consisting of a spherical shape, a cylindrical shape, a cuboid shape, a cavern shape, a toroid shape, and any combinations thereof, can be internally supported by vertical pillars made of semiconductor material from the substrate and/or the first epitaxial layer.

According to yet another embodiment, which can be combined with embodiments described herein, the shape of the insulating region IR can include three-dimensionally rounded edges. Thereby, high peak values of an electric field can be avoided or at least reduced.

According to a further embodiment which can be combined with other embodiments described herein, the insulating regions IR such as, but not restricted to, cavities can be surrounded at least partially by a p-doped zone. The p-doped zone further enhances the effect of the insulating region in that the transit of charge carriers in the edge termination region RR is prevented or at least reduced. Thereby, a continuous n-path from the substrate S into the drift region DT can be avoided.

In addition to that, or alternatively, the insulating region IR can be provided as a buried dielectric layer or can be coated with a dielectric. The dielectric layer can be deposited at locations where the insulating regions are desired, before succeeding layers are deposited. According to another embodiment, an inner layer of the insulation regions IR is coated with the dielectric layer e.g. via a deposition process or a thermal oxidation process which is carried out when still a connection of the insulation regions IR is present e.g. via a remaining, not collapsed or not fused trench during the annealing process in an atmosphere containing hydrogen or an auxiliary trench opening the insulation regions IR after the annealing process. The dielectric layer can include, but is not restricted to, silicon oxide ($SiO_2$), silicon nitride ($Si_3N_4$), silicon oxinitride ($SiO_xN_y$), zirconium oxide ($ZrO_2$), tantalum oxide ($Ta_2O_5$), titanium oxide ($TiO_2$) and hafnium oxide ($HfO_2$).

Figure 3:
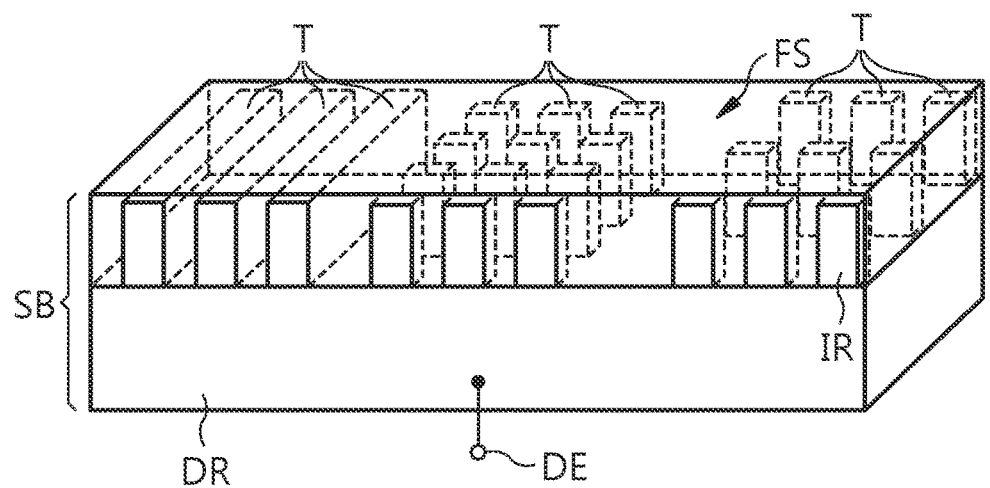
FIG. 3 illustrates a perspective view of a portion of a semiconductor chip wherein a processing step for providing insulating region is depicted, according to an embodiment.
Figure 4:
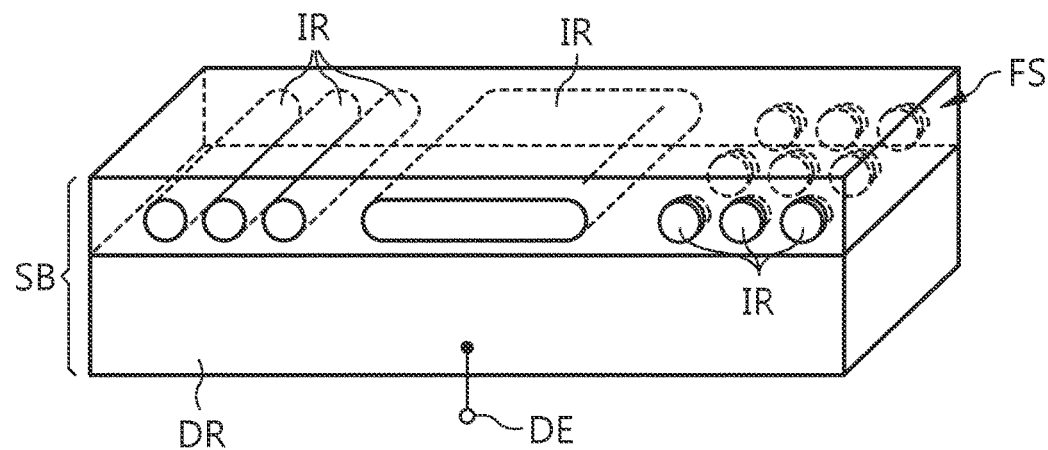
FIG. 4 illustrates a perspective view of a portion of a semiconductor chip wherein a processing step for providing insulating region is depicted, according to an embodiment.
Figure 5:
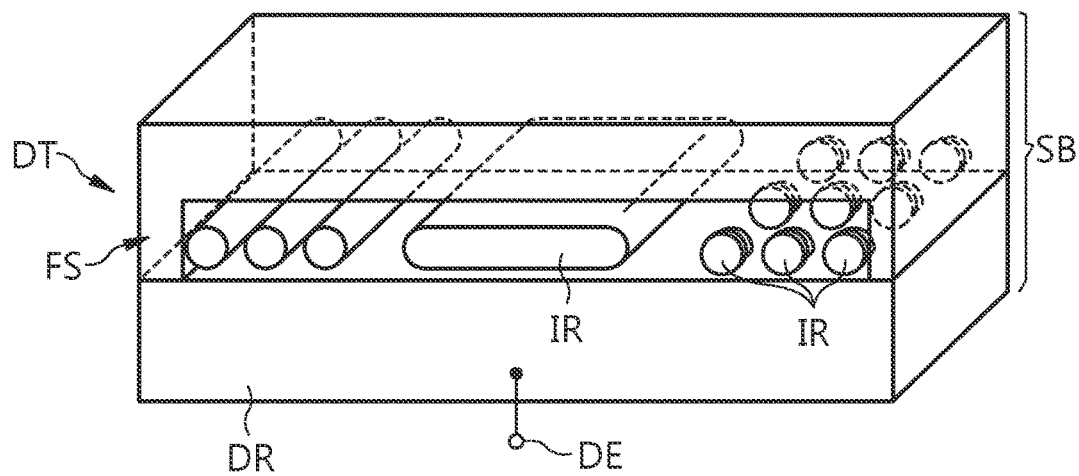
FIG. 5 illustrates a perspective view of a portion of a semiconductor chip wherein a processing step for providing insulating region is depicted, according to an embodiment.

Referring now to FIGS. 3-5, a processing step sequence for the formation of specific insulating structures according to an embodiment, which can be combined with other embodiments described herein, is illustrated. The semiconductor body SB can include a field stop zone FS between the drain region DR and the drift region DT, as indicated in FIGS. 3-5. The insulating regions IR shown in FIGS. 3-5 can then be embedded, at least partially, in the field stop zone FS. The field stop zone FS can be provided as a zone of the semiconductor body SB, which is deposited onto the drain region DR or the substrate S, respectively.

According to an embodiment, which can be combined with other embodiments described herein, a method of forming an insulating region IR within the semiconductor body SB, in particular in the edge termination region RR of the semiconductor body SB is provided. The method includes providing the substrate S, which can be highly doped. Then the semiconductor body SB is formed by depositing at least one first epitaxial layer onto the substrate S. Herein, a vertical thickness of the first epitaxial layer can be larger than a vertical extension of the cavity (insulating region IR).

Then, as illustrated in FIG. 3, at least one trench can be etched into the deposited first epitaxial layer, the trench being provided at a location where an insulating region IR is desired after having finished the process. A vertical extension of the etched trench can be larger than the vertical extension of the cavity (insulating region IR). "Vertical" as used in this specification intends to describe an orientation, which is arranged substantially perpendicular to the main surface of the semiconductor substrate S. A lateral width of the trench can be small enough such that the trench can be bridged at a succeeding processing step. "Lateral" as used in this specification intends to describe an orientation substantially parallel to the main surface of a semiconductor substrate S.

At the next step the semiconductor body SB is annealed, the annealing step being performed, e.g. in an atmosphere containing hydrogen at a pressure of a few Torr and at a temperature of approximately 900 to 1150° C., such that a closed bridge is formed over the trench region. The situation after the annealing step is illustrated in FIG. 4. Then, at least one further epitaxial layer is deposited onto the annealed semiconductor body SB and a power semiconductor device 100 as indicated in FIG. 5 is obtained. The deposition process can be performed shortly after the annealing step in a same process chamber. Thereby, an insulating region IR is formed as a cavity between the epitaxial layers at the location of the trench (see FIG. 5).

The introduction of the field stop zone FS in the semiconductor body SB can facilitate the use of substrate material with low base doping or with a doping complementary to that of the field stop zone. Thereby, the field stop zone FS can be doped in such a way as to prevent or at least reduce a penetration of a space charge zone into the substrate. Thus, reduction of breakdown voltage and/or "punch-through" of the power semiconductor device 100 can be avoided. Semiconductor devices including field stop zones FS are denoted as field stop components and include, but are not limited to, power MOSFETs, Insulated Gate Bipolar Transistors (IGBTs), diodes, thyristors or bipolar transistors.

Thereby, the semiconductor power device 100 is obtained which includes the source electrode SE (not shown in FIGS. 3-5), the drain electrode DE and the gate electrode GE (not shown in FIGS. 3-5), and a semiconductor body SB being laterally subdivided into the active region CR and an edge termination region RR adjacent to the active region CR. As shown in FIGS. 3-5, the semiconductor body SB includes the substrate S, the drain region or emitter region DR on the substrate connected to the drain electrode or emitter electrode DE, the field stop zone FS on the drain region DR, a drift region DT on the field stop zone FS, and the insulating regions IR arranged substantially in the field stop zone FS. The insulating region IR can be arranged, at least partially, within the field stop zone FS, predominantly in the edge termination region RR and adjacent to the drain region DR, the insulating region IR covering, at least partially, the drain region DR and being adapted for blocking in the edge termination region RR, at least partially, a vertical transit of charge carriers through the drift region DT.

It is noted here that an introduction of an insulating region IR is not limited to the field stop zone FS, rather an insulating region IR can be embedded in the drift region DT, in the drain region DR, or in the field stop zone FS. According to a modification thereof, the insulating region IR can be arranged at an interface between the drain region DR and the field stop zone FS, or at an interface between the drain region DR and the drift region DT, or at an interface between the field stop zone FS and the drift region DT. If the insulating regions IR are substantially buried in the substrate S, deposition of the first epitaxial layer is not performed. Here, an epitaxial layer and/or the field stop zone FS and/or a layer providing the drift region DT can be deposited directly onto the cavities providing the insulating regions IR.

According to an embodiment which can be combined with other embodiments described herein, longitudinal cavities can be supported by pillars (not shown in the drawings). According to a further alternative, a plurality of closely spaced trenches T can be formed in the semiconductor body SB and in the field stop zone FS, respectively. Whether a trench T transforms to a single cavity or adjacent trenches T merge to a common cavity depends on the lateral spacing, i.e. a pitch of the trenches T. When arranging a plurality of closely spaced trenches T in an array, a cavity is formed as an insulating region IR that has, in top view, the two-dimensional extension of the array.

The insulating region IR can have a plane shape as illustrated in the center of FIG. 4. For example, a rectangular array of closely spaced trenches T form a substantially rectangular cavity with rounded corners (see perspective view of FIG. 4) while a row of closely spaced trenches T forms a substantially elongated cavity. Rounded corners can be provided such that undesired peak values of electric fields are avoided or at least reduced. Therefore, by selecting the arrangement of the trenches T, virtually any cavity arrangement and shape can be formed.

Figure 6:
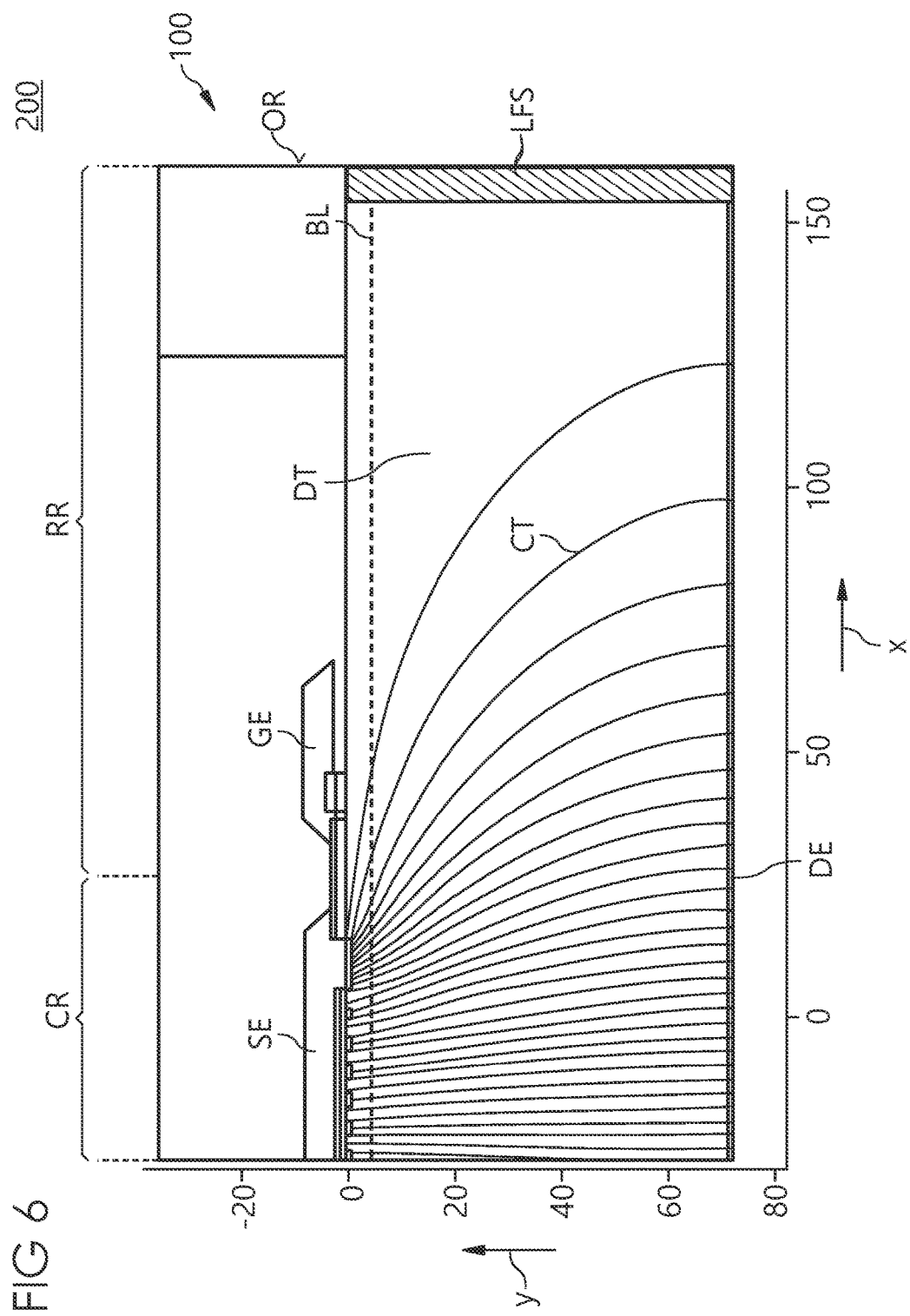
FIG. 6 is a cross-sectional view of a power semiconductor chip, the cross-sectional view including a current density distribution graph for explaining current density distribution.

FIG. 6 illustrates a cross section of a power semiconductor device 100 wherein a current density distribution graph 200 with current threads CT is superposed in the Figure, for illustration purpose and for comparing the current distribution, to a current distribution with included insulating regions IR. The current density distribution graph 200 results from a simulation of the current flow between the source electrode SE and the drain electrode DE when the body diode of the power semiconductor device 100 is in the conducting mode, i.e. when the voltage at the source electrode SE of a n-channel MOSFET is more positive than the voltage at the drain electrode DE. The power semiconductor device 100 is subdivided in the active region CR and the edge termination region RR. The edge termination region RR can include, at its outer rim OR, a lateral field stop zone LFS. FIG. 6 depicts a numerical simulation of a current density distribution in a situation where none of the insulating regions IR is present. Current paths originate from the source electrode SE and are then substantially distributed over the area of the drain electrode DE. As can be seen from FIG. 6, the density of the current paths increases at the location where the source electrode SE contacts the drift region DT.

Figure 7:
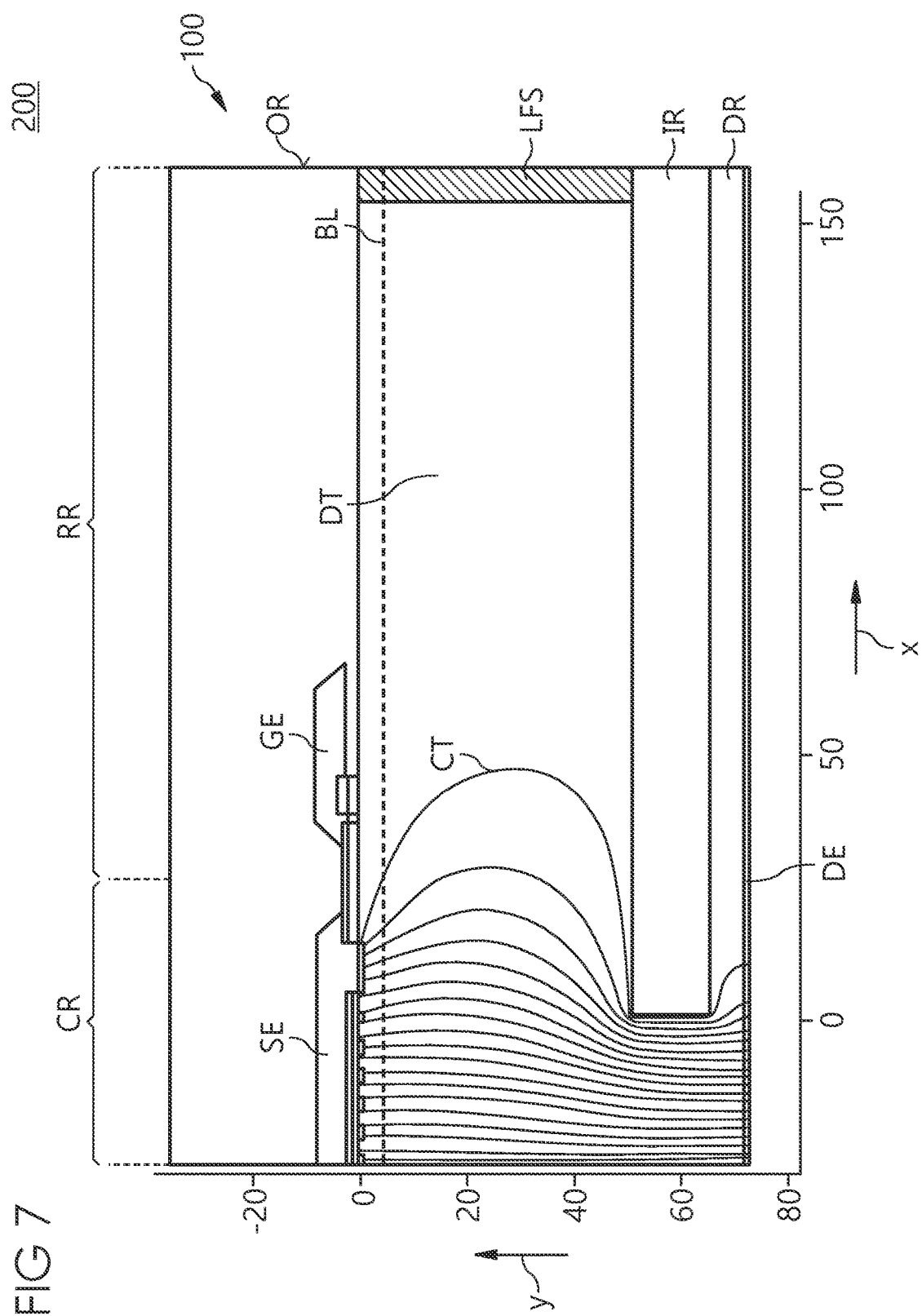
FIG. 7 is a cross-sectional view of a power semiconductor chip, the cross-sectional view including a current density distribution graph for explaining current density distribution, according to an embodiment.

FIG. 7 illustrates a cross section of a power semiconductor device 100 wherein another current density distribution graph 200 with current threads CT is superposed in the Figure, for illustration purpose and for comparing the current distribution to a current distribution with included insulating regions IR. FIG. 7 depicts a numerical simulation of a current density distribution in a situation where insulating regions IR are present. As can be seen from the generated current paths, the current density at the source electrode SE has decreased compared to the current density at the source electrode SE in the situation shown in FIG. 6 without any insulating regions. In addition to that, charge carrier generation in the edge termination region RR is reduced. In other words, a current flow (indicated by current threads CT) in the edge termination region RR of the power semiconductor device 100 is avoided or at least reduced.

If the body diode of the power semiconductor device 100 is in the conducting mode, i.e. if the voltage at the source electrode SE of a n-channel MOSFET is more positive than the voltage at the drain electrode DE as shown in FIG. 6 and FIG. 7 the drift region DT of the power semiconductor device 100 is flooded with an electron and hole plasma. Since in this operation mode, there is no significant electric field in the drift region DT, the concentration of electrons and holes is substantially equal and much higher than the background doping of the drift region DT.

FIG. 8 depicts a graph illustrating different electron and hole densities 203 as a function of a lateral position x in a direction substantially parallel to the substrate surface. A first electron and hole density distribution 201 including two simulation curves corresponds to the situation with insulating region IR shown in FIG. 7, whereas a second electron and hole density distribution 202 including two further simulation curves corresponds to the situation without any insulating regions IR as shown in FIG. 6. The simulated electron and hole density distributions 201 and 202, respectively, are distribution curves taken along a dashed line BL in the x-direction shown in FIG. 6 and FIG. 7, respectively. A comparison of the first and second electron and hole density distributions 201 and 202, respectively, indicates a reduction of the density of electrons and holes for the situation where at least one insulating region IR is provided in the semiconductor body SB. A lateral position denoted by a reference numeral x-SE corresponds to an x-coordinate where the source electrode SE contacts the drift region DT. At this source electrode-contact point with the drift region DT the electron and hole density peaks for both situations depicted in FIGS. 6 and 7, respectively, however, the first electron and hole density distribution 201 has lower peak values as compared to the second electron and hole density distribution 202.

FIG. 9 illustrates a reverse recovery behavior 300 of two MOSFET body diodes when they are commutated from their conductive operation into blocking operation by an auxiliary switch, e.g. another MOSFET acting as switch which is turned-on. In FIG. 9, time dependences of both current I and energy E are depicted. Curves 401 and 402 represent cell region currents, i.e. currents flowing in a substantially vertical direction from the source electrode SE to the drain electrode DE in the cell region CR (see FIGS. 6 and 7), as a function of time t. Herein, a first cell region current 401 corresponds to the situation depicted in FIG. 6, where no insulating region IR is provided in the edge termination region RR. On the other hand, a second cell region current 402 corresponds to the situation depicted in FIG. 7, where an insulating region IR is provided in the edge termination region RR, within the drift region DT adjoining the drain region DR. Curves 301 and 302 represent edge termination region currents, i.e. currents flowing in a substantially vertical direction from the source electrode SE to the drain electrode DE in the edge termination region RR (see FIGS. 6 and 7), as a function of time t. Herein, a first edge termination region current 301 corresponds to the situation depicted in FIG. 6, where no insulating region IR is provided in the edge termination region RR. On the other hand, a second edge termination region current 302 corresponds to the situation depicted in FIG. 7, where an insulating region IR is provided in the edge termination region RR, within the drift region DT adjoining the drain region DR. It is noted here that the currents are indicated in arbitrary units and that the point of origin for the time axis is arbitrarily chosen. In this example, until a time step 2.005 µs a forward current in the body diodes is flowing from the source electrode to the drain electrode, the forward current being depicted in FIG. 9 as a current with a negative sign. At a time step of 2.005 µs the commutation sequence starts, e.g. if an auxiliary switch causes the current to change sign. In the present example, at a time step of about 2.020 µs zero current is obtained. At a time thereafter an excess charge stored in the drift region DT of the edge termination region RR is removed. As can be seen from energy (E) curves 501, 502 which start to rise around time step 2.080 µs to time step 2.090 µs most of the charge stored in the cell region CR is removed and the voltage at the drain electrode DE starts to rise significantly above the potential of the source electrode SE. In case of the situation depicted in FIG. 6 the rising voltage between drain electrode DE and source electrode removes the stored charges in the edge termination region RR causing the first edge termination region current 301 to increase significantly until the excess charge is removed from the edge termination region RR. In contrast to that, the amount of excess charge stored in the situation depicted in FIG. 7 is much lower and hence the second edge termination region current 302 is much lower. After a time step of 2.105 µs or 2.125 µs substantially the entire excess charge stored in the device designed according to FIG. 7 or according to FIG. 6, respectively, is removed. Stray inductances which can be present, result in a continuation of a total current with a certain slope, e.g. by causing avalanche generation until zero level is obtained again and the commutation has ended, at approximately time step 2.140 µs.

As can be clearly seen from the time evolution of the two edge termination region currents 301, 302, the absolute value of the second edge termination region current 302 is much lower and much smoother than that of the first edge termination region current 301. This is in correspondence with the fact that the current density and therefore the amount of stored charge in the situation depicted in FIG. 7, where an insulating region IR is provided in the edge termination region RR (rim region), within the drift region DT adjoining the drain region DR, are much lower than the current density and therefore the amount of stored charge in the situation depicted in FIG. 6, where no insulating region IR is provided in the edge termination region RR. Since the two edge termination region currents 301, 302 are concentrated in the outermost parts of the cell region CR adjoining the edge termination region RR, the second edge termination region current 302 results in a lower current density, and thus, less stress for the power semiconductor device 100 as compared to the first edge termination region current 301. Thereby, a failure probability of the device can be reduced by introducing the at least one insulating region IR according to embodiments.

As can be clearly seen from the time evolution of the two cell region currents 401, 402, the second cell region current 402 is smoother than the first cell region current 401. The second cell region current 402 exhibits a linear decrease from time step 2.105 µs, e.g. provided by carriers generated by avalanche effects or by capacitive re-turn-on of the channel whilst the first cell region current 401 starts increasing at a later point in time. It is noted here that steep slopes can result in high stress within the devices and additional problems such as electromagnetic interference, etc.

A total source-drain current through the semiconductor body SB can be represented by the sum of the respective cell region current 401 and a respective edge termination region current indicated by a reference numeral 301 shown in FIG. 9, for the situation indicated in FIG. 6. Furthermore, the total source-drain current through the semiconductor body SB can be represented by the sum of the respective cell region current 402 and a respective edge termination region current indicated by a reference numeral 302, for the situation indicated in FIG. 7. A time evolution of currents in the edge termination region RR (see FIGS. 6 and 7) can be explained as follows. Due to the strong decrease over time of the first cell region current 401 (situation according to FIG. 6), the edge termination region current 301 exhibits an increase such that the edge termination region RR of the semiconductor body SB carries the remaining current, i.e. the "total current minus the first cell region current 401". The situation with respect to FIG. 7 is different: Here, a slope of the second cell region current 402 is less steep than in the situation corresponding to FIG. 6 (first cell region current 401).

Figure 10A:
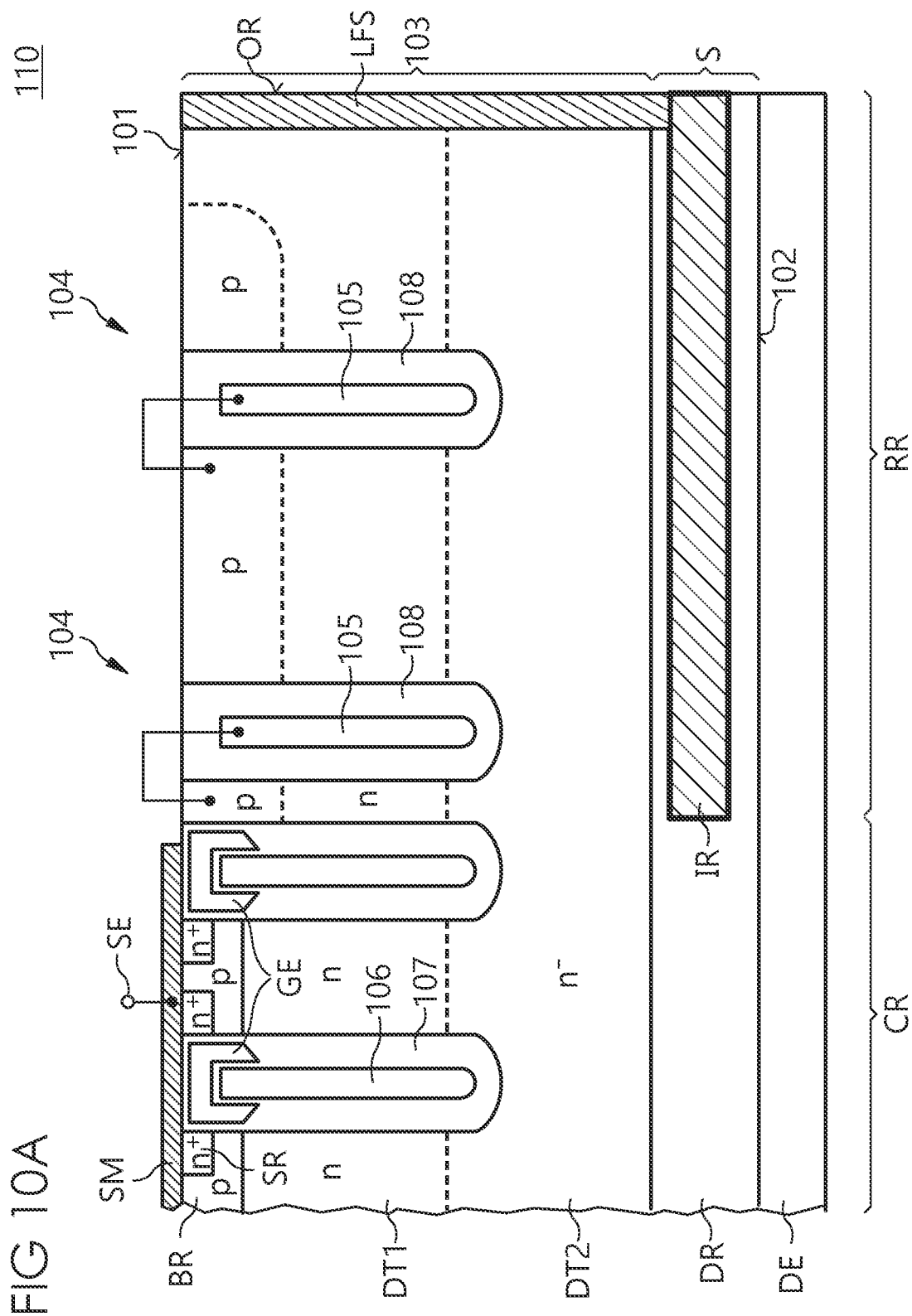
FIGS. 10A and 10B illustrate different semiconductor circuit elements, each of which includes an insulating region.
Figure 10B:
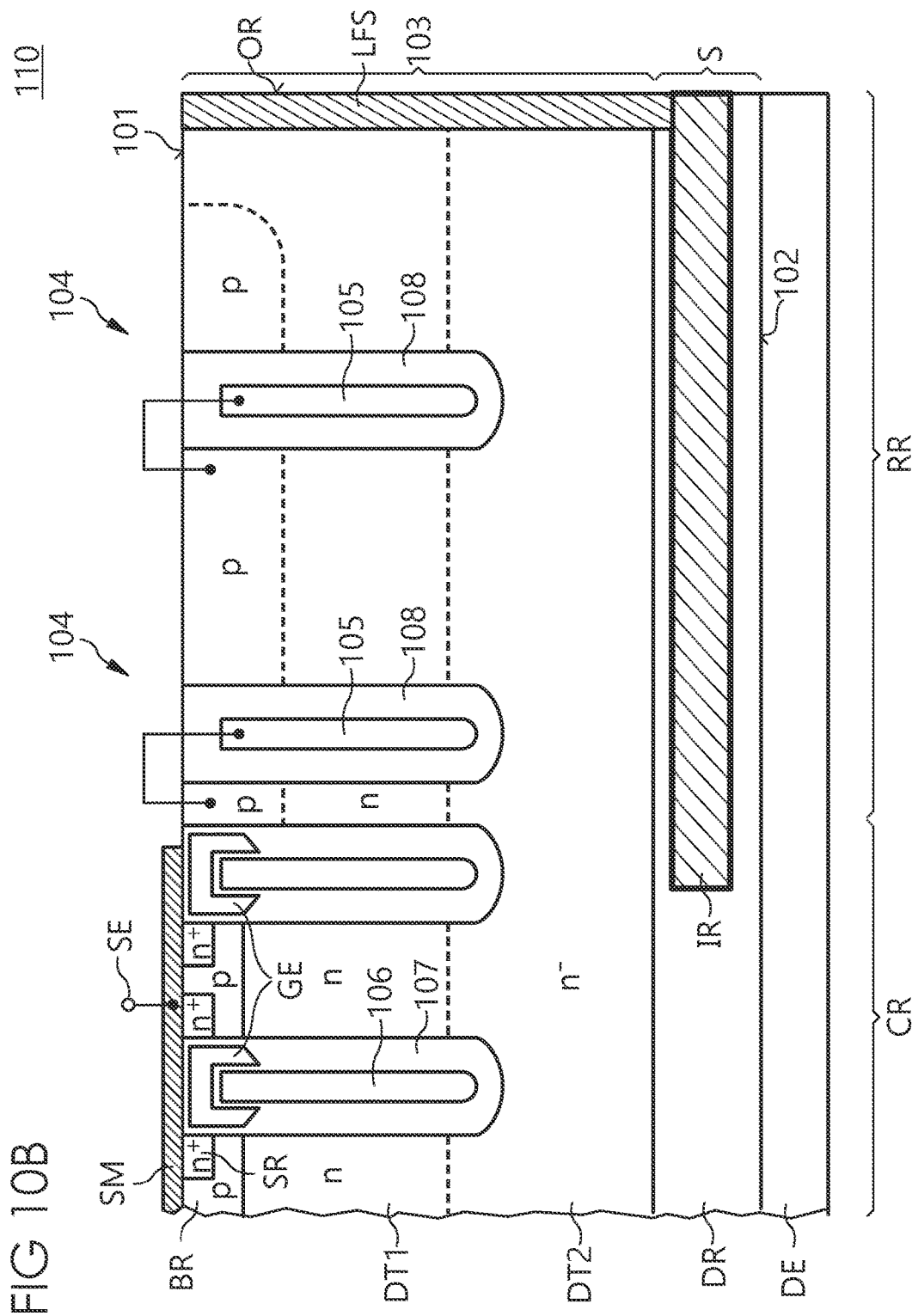
Figure 12:
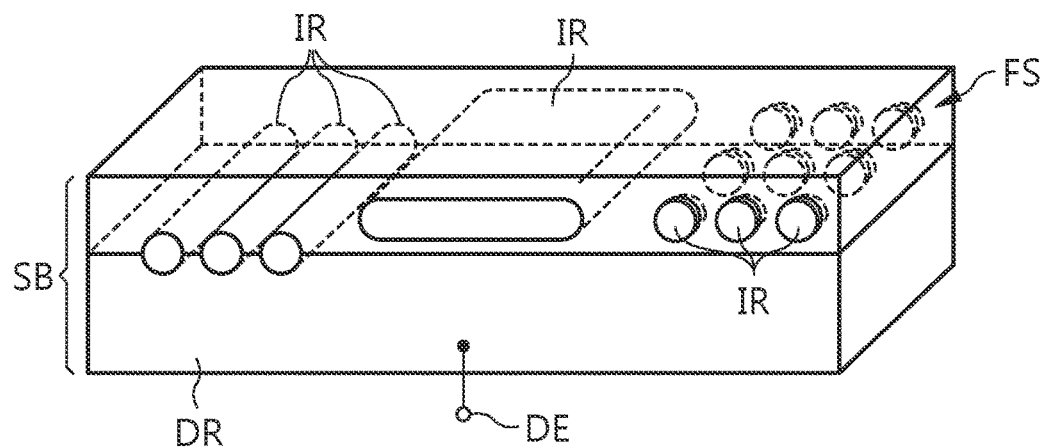

FIGS. 10A and 10B illustrate respective cross sections of a power semiconductor device 110 including an insulating region according to embodiments, which can be combined with other embodiments described herein. A semiconductor body of the semiconductor device 110 has a first, upper side 101 and a second, lower side 102. The semiconductor device 110 without insulating regions or cavities is described in the application DE 10 2006 036 347 B4, the disclosure of which is incorporated herein by reference to the extent that the application is not inconsistent with this disclosure. FIGS. 10A and 10B illustrate the introduction of the insulating region IR in a semiconductor device 110.

The semiconductor device 110 includes electrodes 105, 106 protruding into the drift region DT of the semiconductor body. The electrodes include field electrodes 106 in the cell region CR and rim electrodes 105 in the edge termination region RR. The electrodes are surrounded by respective dielectric layers, i.e. the field electrode 106 is surrounded by a field electrode dielectric layer 107, wherein the rim electrode 105 is surrounded by a rim electrode dielectric layer 108. In the application examples shown in FIGS. 10A and 10B, the insulating region IR is embedded into the substrate S, e.g. within the drain region DR. The drift region DT is shown to cover the insulating region IR such that a cavity of a specified three-dimensional shape can be provided.

According to embodiments which can be combined with other embodiments described herein, the insulating region IR can have different shapes. A three-dimensional formation of the insulating region IR thus can be selected from the group consisting of a spherical shape, a cylindrical shape, a cuboid shape, a cavern shape, a toroid shape, and any combinations thereof.

The semiconductor device 110 shown in FIGS. 10A and 10B includes a source electrode SE connected to a source metallization SM, a drain electrode DE and gate electrodes GE. The semiconductor body which is laterally subdivided into a cell region CR and an edge termination region RR adjacent to the cell region CR includes the drain region DR connected to the drain electrode DE and an epitaxial semiconductor layer 103 deposited onto the drain region DR. As shown in FIGS. 10A and 10B, the semiconductor body includes the substrate S, the drain region DR on the substrate connected to the drain electrode DE, the drift region DT on the drain region DR, and the insulating region IR.

According to the embodiments shown in FIGS. 10A and 10B, the insulating region IR can be arranged, at least partially, within the drain region DR, predominantly in the edge termination region RR, the insulating region IR covering, at least partially, the drain region DR and being adapted for blocking in the edge termination region RR, at least partially, a vertical transit of charge carriers through the drift region DT. At the outer rim OR of the edge termination region RR, a lateral field stop zone LFS can be provided. As shown in FIG. 10B, the insulating region IR can also extend into the cell region CR.

FIG. 11 illustrates another power semiconductor device 100, which includes an insulating region. The power semiconductor device 100 shown in FIG. 11 is a three-terminal compensation device such as a field-effect transistor (FET). The first doping region SR connected to a first terminal can be of the first conductivity type such as n-type, and can be formed by a highly n-doped source region. In the cell region CR, the drift region DT includes p-columns 601 and n-columns 602 arranged adjacent to each other. A body region BR of the second conductivity type can be arranged between the source region and the weakly n-doped drift region DT. The drift region DT is arranged between the body region BR and the second doping region DR, which is connected to a second terminal DE and which can be formed of the first conductivity type, e.g. by a highly n-doped drain region in case of a FET. The n-column 602 of drift region DT forms a pn-junction with the body region BR. An optional field stop region of the first conductivity type can be arranged between the first portion DT1 of the drift region DT and the second doping region DR. The field stop region has a higher doping concentration than the net doping of the first portion DT1 of the drift region DT. The net doping of the first portion DT1 of the drift region DT can be calculated by adding the doping of the p-columns 601 and n-columns 602 respecting the signs of the doping areas. A gate region GR, which is electrically connected to a gate electrode GE and which is insulated from the body region BR by means of a gate dielectric GD, is connected to a third terminal. A channel region is formed in the body region BR next to the gate dielectric GD and connects the first doping region SR to the n-columns 602 in the drift region DT. The conductivity of the channel region is controllable by a voltage applied to the gate electrode GE.

According to an embodiment, the gate region GR is a planar gate region and located substantially parallel to a surface of the first side 101 of the semiconductor body SB, the gate region being adapted for controlling an inversion channel in the body region BR which is substantially parallel to the first surface 101. According to a further embodiment, the gate region GR is partly located in a trench extending into the semiconductor body SB from the first side in a vertical direction and controlling the inversion channel in the body region BR, which is substantially perpendicular to the first surface 101.

According to yet another embodiment which can be combined with embodiments described herein, the edge termination region RR can also be provided with p-columns 601 and n-columns 602 arranged adjacent to each other. A doping level or a net doping level, respectively, of the first portion DT1 of the drift region DT is adjusted to be lower than a doping level of the second portion DT2 of the drift region DT of the edge termination region RR. The insulating region IR can laterally extend to the outer rim OR, as shown in FIG. 1A, or can end at a distance away from the outer rim OR, as depicted in FIG. 11. Thereby, a higher mechanical stability of the power semiconductor device 100 can be provided, if the insulating region IR does not extend to the outer rim OR.

The insulating regions IR according to embodiments described herein can be used in edge termination regions or rim regions RR, respectively, of semiconductor devices. Furthermore, the insulating regions IR can be applied at gate pads or in smart power ICs where a cavity or insulating region IR according to embodiments described herein can be arranged between a substrate and an integrated circuit including logic circuitry.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The written description above uses specific embodiments to disclose the invention, including the best mode, and also to enable any person skilled in the art to make and use the invention. While the invention has been described in terms of various specific embodiments, those skilled in the art will recognize that the invention can be practiced with modification within the spirit and scope of the claims. Especially, mutually non-exclusive features of the embodiments described above can be combined with each other. The patentable scope is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

It is to be understood that the features of the various example embodiments described herein can be combined with each other, unless specifically noted otherwise.

Although specific embodiments have been illustrated and described herein, it will be appreciated by those of ordinary skill in the art that a variety of alternate and/or equivalent implementations can be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor device, comprising:
a semiconductor body having a first side, a second side opposite the first side and an outer rim, the semiconductor body comprising an active region and an edge termination region arranged between the active region and the outer rim, the semiconductor body further comprising:
a first doping region in the active region and connected to a first electrode arranged on the first side of the semiconductor body;
a second doping region in the active region and the edge termination region and connected to a second electrode arranged on the second side of the semiconductor body;
a drift region between the first doping region and the second doping region, the drift region comprising a first portion adjacent to the first side of the semiconductor body and a second portion arranged between the first portion and the second doping region; and
an insulating region arranged in the edge termination region between the second doping region and the first portion of the drift region,
wherein the second portion of the drift region extends across a thickness of the insulation region and contacts sides of the insulation region that extend in a thickness direction, the thickness direction being measured in a direction perpendicular to the first and second sides.

2. The power semiconductor device of claim 1, wherein the insulating region comprises a cavity.

3. The power semiconductor device of claim 2, wherein the cavity is filled with a gas selected from the group consisting of air, argon, nitrogen, oxygen, hydrogen, and any combination thereof.

4. The power semiconductor device of claim 2, wherein the insulating region is at least partially surrounded by a p-doped zone.

5. The power semiconductor device of claim 1, wherein the insulating region is a buried dielectric layer.

6. The power semiconductor device of claim 1, wherein the insulating region extends laterally across the edge termination region and a portion of the active region adjacent to the edge termination region.

7. The power semiconductor device of claim 1, wherein the drift region has a given maximum thickness, and wherein a thickness of the first portion of the drift region amounts to approximately 30% to 95% of the given maximum thickness of the drift region.

8. The power semiconductor device of claim 1, wherein a shape of the insulating region comprises three-dimensionally rounded edges.

9. The power semiconductor device of claim 1, wherein the power semiconductor device is selected from the group consisting of a MOSFET, a MISFET, an IGBT, a JFET, a HEMT, a thyristor, and a diode.

10. The power semiconductor device of claim 1, wherein the insulating region extends from the second portion of the drift region at least partially into the second doping region.

11. The power semiconductor device of claim 1, wherein the second side extends along a single plane in both the active region and the edge termination region, and wherein the insulating region is separated from the drift region by the second doped region.

12. A power semiconductor device, comprising:
a semiconductor body having a first side, a second side opposite the first side and an outer rim, the semiconductor body comprising an active region and an edge termination region arranged between the active region and the outer rim, the semiconductor body further comprising:
a first doping region in the active region and connected to a first electrode arranged on the first side of the semiconductor body;
a second doping region in the active region and the edge termination region and connected to a second electrode arranged on the second side of the semiconductor body;
a drift region between the first doping region and the second doping region;
a field stop zone arranged between the drift region and the second doping region, the field stop zone having a higher doping concentration than the drift region and being of a same conductivity type as the drift region; and
an insulating region arranged in the edge termination region adjacent to the second doping region and at least partially within the field stop zone, the insulating region forming a blocking region in the edge termination region to at least partially block a vertical transit of charge carriers,
wherein the field stop region is a semiconductor region that extends across a thickness of the insulation region and contacts sides of the insulation region that extend in a thickness direction, the thickness direction being measured in a direction perpendicular to the first and second sides.

13. The power semiconductor device of claim 12, wherein the insulating region comprises a cavity.

14. The power semiconductor device of claim 12, wherein the insulating region extends laterally across the edge termination region and a portion of the active region adjacent to the edge termination region.

15. The power semiconductor device of claim 12, wherein the second side extends along a single plane in both the active region and the edge termination region, and wherein the insulating region is separated from the drift region by the second doped region.

16. A method for manufacturing a power semiconductor device, the method comprising:
providing a semiconductor substrate having a surface;
forming a first epitaxial layer on the surface of the semiconductor substrate;
etching one or more trenches in the first epitaxial layer;
annealing the first epitaxial layer comprising the one or more trenches in an atmosphere containing hydrogen to transform a geometry of the one or more trenches into an insulation region;
forming a second epitaxial layer on the first epitaxial layer after the annealing of the first epitaxial layer, wherein the substrate, the first epitaxial layer and the second epitaxial layer form a semiconductor body having a first side, a second side opposite the first side and an outer rim, the semiconductor body comprising an active region and an edge termination region arranged between the active region and the outer rim;
forming a first doping region in the active region;

forming a first electrode arranged on the first side of the semiconductor body in contact with the first doping region;

forming a second doping region in the active region and the edge termination region; and forming a second electrode arranged on the second side of the semiconductor body in contact with the second doping region, wherein the first and second epitaxial layers form a drift region between the first doping region and the second doping region, the drift region comprising a first portion adjacent to the first side of the semiconductor body and a second portion arranged between the first portion and the second doping region, and wherein the second portion of the drift region extends across a thickness of the insulation region and contacts sides of the insulation region that extend in a thickness direction, the thickness direction being measured in a direction perpendicular to the first and second sides.

17. The method of claim 16, wherein the geometry of the one or more trenches is transformed such that material of first epitaxial layer completely covers one or more cavities.

* * * * *

UNITED STATES PATENT AND TRADEMARK OFFICE
CERTIFICATE OF CORRECTION

PATENT NO. : 10,134,845 B2
APPLICATION NO. : 15/199135
DATED : November 20, 2018
INVENTOR(S) : Hans-Joachim Schulze et al.

Page 1 of 1

It is certified that error appears in the above-identified patent and that said Letters Patent is hereby corrected as shown below:

In the Claims

Column 21, Line 22 (Claim 17, Line 3), please change "first" to -- the first --.

Signed and Sealed this
Twelfth Day of February, 2019

Andrei Iancu
*Director of the United States Patent and Trademark Office*